July 18, 1972 K. G. ASHAR 3,677,837

METHOD OF MAKING PEDESTAL TRANSISTOR HAVING MINIMAL SIDE INJECTION

Filed Aug. 6, 1969 2 Sheets-Sheet 1

INVENTOR
KANU G. ASHAR

BY Wolmar J. Stoffel

ATTORNEY

United States Patent Office 3,677,837

Patented July 18, 1972

3,677,837

METHOD OF MAKING PEDESTAL TRANSISTOR HAVING MINIMAL SIDE INJECTION

Kanu G. Ashar, Wappingers Falls, N.Y., assignor to International Business Machines Corporation, Armonk, N.Y.

Filed Aug. 6, 1969, Ser. No. 847,857
Int. Cl. H01l 7/36, 11/00; B01j 17/00
U.S. Cl. 148—175 4 Claims

ABSTRACT OF THE DISCLOSURE

A high performance transistor formed in a monolithic semiconductor body with a projecting pedestal portion, an emitter region in the upper portion of the pedestal with the emitter base junction terminating at the periphery of the pedestal.

BACKGROUND OF THE INVENTION

Field of the invention

This invention relates to semiconductor devices more particularly high performance transistors and method for forming such transistors.

Discussion of prior art

In the past, many elaborate and sometimes complex methods have been designed to increase the frequency response of planar transistors. In designing transistors for maximum frequency response, the primary objective is to minimize the emitter junction capacitance consistent with the allowable current rating and decrease the base transit time consistent with the allowable voltage rating. The base transit time is decreased by maintaining, through diffusion, very thin base widths. Reduction in emitter junction capacitance has been obtained by reducing emitter areas and impurity concentration in the base region.

A semiconductor device has an inherent capacitance across a PN junction which is determined generally by the width of the reverse bias depletion layer and the areas of the opposed boundaries of the depletion layer which may be analogized to capacitor plates. High frequency response requires that the capacitance at the PN junction and in particular the emitter-base junction be low. The capacitance can be lowered by reducing the area of the junction, and/or by increasing the resistivity of the respective emitter and base region adjacent the junction. However, increasing the resistivity of the material has an adverse effect on the gain of the device which must be maintained at a reasonably high value. Thus, in conventional planar type transistors the selection of the resistivity amounts to a compromise.

In conventional planar transistor devices the base is diffused into a wafer followed by a second diffusion within the base to form the emitter region. This inevitably results in high impurity concentrations on both sides of the emitter-base junction at the surface. The emitter-base capacitance in a transistor device is made up of the collective PN junction capacitances of the bottom of the emitter and the sidewalls of the emitter. While the area of the PN junction on the sidewalls is relatively small the impurity concentration particularly at the surface is relatively high. Thus, the contribution of capacitance by the sidewalls of the emitter is very significant. In some very small fast devices the sidewalls contribute up to 70% of the emitter-base capacitance. Further, conventional planar transistor has its emitter sides embedded in the base. When the emitter-base junction of the transistor is forward biased, part of the current flows through intrinsic (bottom) shorter base width region while the other part flows through extrinsic (sides) longer base width region. The transit time and cut off frequency of the transistor are determined by the combined influence of the bottom and side carrier flow through the base region. The contribution of carrier flow through extrinsic base results in lower cut off frequency than if the flow were confined to only intrinsic base region. Moreover, flow of carrier current in the sides of the emitter results in additional charge storage in extrinsic base and increases delay during switching in logic application. Another disadvantage of the high impurity concentration at the surface of a conventional planar device is that tunneling occurs which results in a lowering of the current gain. Still further, increased dislocation density and subsequent increase in trapping centers occurs. The trapping centers result in increased recombination-generation current which reduces the current gain at low currents and also gives rise to increased noise in linear amplifier application.

Recessed type transistor structures are known. These structures could eliminate the adverse effect in regard to capacitance, tunneling, and dislocation density for large geometry transistors. However, the techniques for making such mesa type transistors is not presently applicable to the technology for making small planar high speed integrated circuit devices. In the techniques for producing mesa type structures the emitter sides are exposed to the environment during processing, which results in reverse leakage current of orders of magnitude larger than the planar device, and variations in device properties depending upon chemical etching processes which make them impractical for transistors with cut-off frequencies in the range of 2 to 10 gigahertz and dimensions in terms of 0.1 mil.

SUMMARY OF THE INVENTION

An object of this invention is to provide a high performance transistor, which can be fabricated by methods compatible with planar technology, in which emitter side injection current is eliminated.

Another object of this invention is to provide a method for producing a high performance transistor, which method is compatible with semiconductor planar technology.

Another object of this invention is to provide a method for producing a high performance transistor wherein the emitter has no PN junction sidewalls, which method is practical for producing transistors with cut off frequencies in the ranges of 2 to 10 gigahertz and dimensions on the order of 0.1 mil.

These and other objects are accomplished by the high performance transistor of the invention which is formed in the monocrystalline semiconductor body, the improvement comprising a base provided with a projecting pedestal portion and a recessed top surface surrounding the pedestal portion and the emitter region located on the pedestal with the junction separating the base and emitter region terminating at the periphery of the pedestal above the recessed base surface.

In accordance with the process of the invention for fabricating a miniaturized high speed transistor a masking layer is formed on a monocrystalline semiconductor body wherein a masking portion is provided in registry with the ultimate emitter region. The semiconductor body is then oxidized in the unmasked area surrounding the masked portion. The exposed semiconductor material is converted to an oxide of the semiconductor material. A pedestal portion is thus formed which projects from a resultant surrounding recessed area. A base region of an opposite type semiconductivity is formed in the region surrounding the pedestal and in the base of the pedestal by introducing a suitable impurity. The emitter region of an opposite type semiconductivity is then formed in the upper portion of the pedestal by introducing an appropriate impurity with the emitter base junction extending to the side wall of the pedestal. Ohmic contacts are established with the collect region, base region, and emitter region of the resultant transistor device.

BRIEF DESCRIPTION OF THE DRAWINGS

The foregoing and other objects, features and advantages of the invention will be apparent from the following more particular description of preferred embodiments of the invention as illustrated in the accompanying drawings.

DISCLOSURE OF PREFERRED EMBODIMENTS

The drawings, which depict preferred specific embodiments of the method of the invention and also illustrate preferred embodiments of the structure of the invention, do not depict the device in true scale. The vertical dimension of the cross-sectional views is expanded relative to the horizontal dimension for ease and clarity of illustration.

Figure 1:
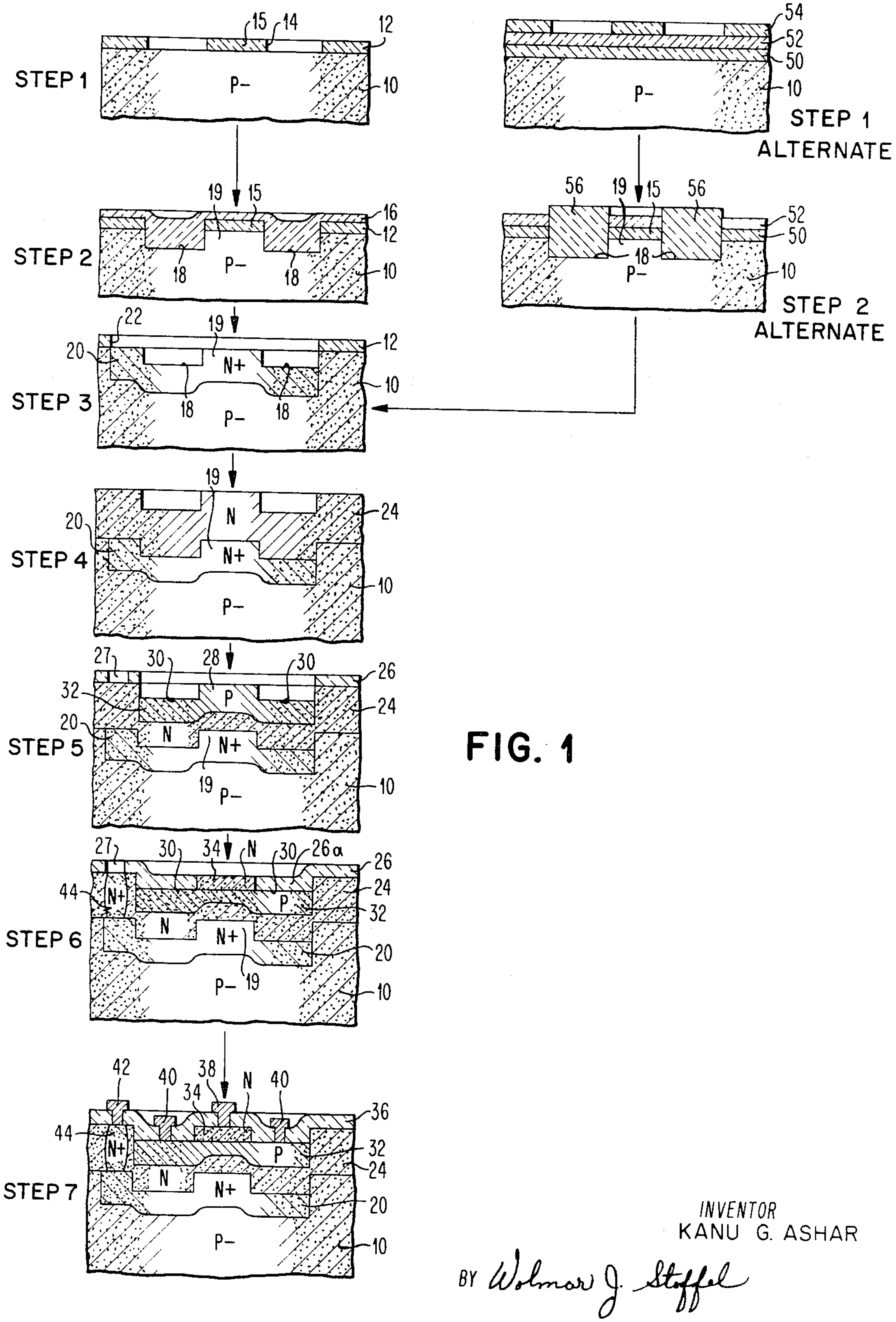
FIG. 1 is a series of sectional views in elevation showing progressive stages of a semiconductor element produced by a preferred embodiment of a method of the invention.

Referring now to FIG. 1, a masking layer 12 of $SiO_2$ is thermally grown or pyrolytically deposited on monocrystalline wafer 10. It is understood that wafer 10 can be of semiconductor material other than silicon as for example germanium, gallium arsenide and the like, and masking layer 12 can be of other material than silicon dioxide as for example silicon nitride. A generally annular opening 14 is formed in masking layer 12 by conventional photolithographic techniques known to the prior art. Masking portion 15 which is isolated from the remaining portion of layer 12 is in registry with the ultimate emitter region of the device to be fabricated. Opening 14 is preferably in registry with the ultimate extrinsic base region of the device to be fabricated although conceivably it could be greater or less than the extrinsic base region. As shown in Step 2 the wafer illustrated in Step 1 is then subjected to a suitable environment which forms a layer of thermal oxide 16. As indicated, during the growth of layer 16 silicon from wafer 10 reacts with oxygen in the areas exposed through opening 14 at a much greater rate than the areas covered by masking layer 12. This results in the formation of a depression 18 in the silicon material of wafer 10 surrounding a pedestal portion 19 underlying masking portion 15. For a high frequency shallow junction transistor the depth of the depression may be of the order of 4000 A. Creation of such a depression would require thermal oxide layer of thickness about a micron to 12,000 A. Layer 16 in the case of silicon can be formed by exposing wafer 10 to steam at elevated temperatures. Since there is no disfused areas in wafer 10 at this point the growth temperatures necessary to form layer 16 can be relatively high. As indicated in Step 3, layer 16 is removed, along with masking portion 15 over pedestal 19, and also a portion of layer 12 sufficient to provide a space for forming a contact which will reach the subcollector region which will be fabricated. The subcollector region 20 is then produced by introducing a suitable impurity, preferably by diffusion techniques, through the enlarged opening 22 in layer 12. As is well-known to those skilled in the art the subcollector region can be produced by any suitable diffusion technique as for example capsule diffusion, flow through diffusion, ion implantation or by the formation of a doped oxide or other layer over the region to be diffused followed by a heating step. Subcollector region 20 is of the opposite type impurity than wafer 10. As indicated in Step 4, layer 12 is then removed from the surface of wafer 10 and an epitaxial layer 24 grown over the surface of wafer 10 by techniques well-known in the art. The pedestal configuration

19 is carried or reproduced in epitaxial layer 24. Epitaxial layer 24 preferably has included a dopant of the same type as subcollector 20. As shown in Step 5 a base forming masking layer 26 is then grown or deposited on the top surface of epitaxial layer 24 and formed to leave exposed the pedestal portion 28 and the surrounding surface 30. The extrinsic and intrinsic base regions are then formed by introducing a suitable impurity into the unmasked region resulting in base region 32. As indicated in Step 6 masking layer 26 is extended over surface 30 leaving exposed the upper portion of pedestal 28. An opening 27 is made for a reach through diffusion. Emitter region 34 of the resultant transistor device is then formed by the introduction of a suitable impurity along with reach through region 44. It is understood that the masking layer 26 and 26a can be of any suitable material, but is preferably silicon dioxide. As shown in Step 7 the entire surface of the transistor is then covered with a suitable passivating layer which covers the top and the side surfaces of the pedestal and emitter region 34. Suitable terminals making ohmic contact to the emitter, base and collector regions are then made by conventional techniques. As shown, emitter contact 38 contacts emitter region 34, base contacts 40 contact the extrinsic regions of base region 32 and collector terminal 42 makes contact with the collector region 20 through reach through diffusion 44. Passivating layer 36 can be of any suitable material or combination of materials as for example silicon dioxide, silicon nitride, glass or the like. The various terminals of the device can be connected into the circuitry in a monolithic integrated circuit device by any suitable type of metallurgy including multi-level metallurgy not shown or illustrated. The transistor when utilized in a monolithic integrated circuit device can be electrically isolated by any suitable isolation technique as for example isolating diffusions made in epitaxial layer 24. Isolation techniques are known to the art and were not described in the fabrication of the device for purposes of clarity and brevity in explanation.

Also illustrated in FIG. 1 are two alternate steps which could be used to replace the original Steps 1 and 2. A silicon dioxide layer 50 and an overlying silicon nitride layer 52 are deposited on the top surface of wafer 10. A masking layer 54 is then deposited over layer 52 and openings made in both layers 50 and 52 to produce an opening corresponding to opening 14 described previously. Layer 54 is preferably silicon dioxide which has been etched using conventional photolithographic techniques. Layer 54 when made of $SiO_2$ is capable of withstanding etchants which will etch through silicon nitride layer 52 as for example fuming phosphoric acid. Layer 54 can then be removed along with the bottom layer 50 with a suitable etchant which removes $SiO_2$. Thermal oxidation of wafer 10 through the openings in 50 and 52 results in oxide portion 56 which produces a pedestal portion 19 surrounded by a flat depressed surface 18. Steps 3 through 7 are basically similar and result in the same basic transistor structure. Some modifications may be necessary in order to handle and remove the silicon nitride layer in the remaining steps which would be obvious to one skilled in the art. The advantage of the method shown in alternate Steps 1 and 2 is that during the thermal growth only the silicon of wafer 10 which is exposed will be affected. Those portions covered by the silicon nitride layer remain intact. This is in contrast to the result shown in Step 2 where a thinner coating of silicon dioxide is formed over the regions covered by masking layer 12.

Figure 2:
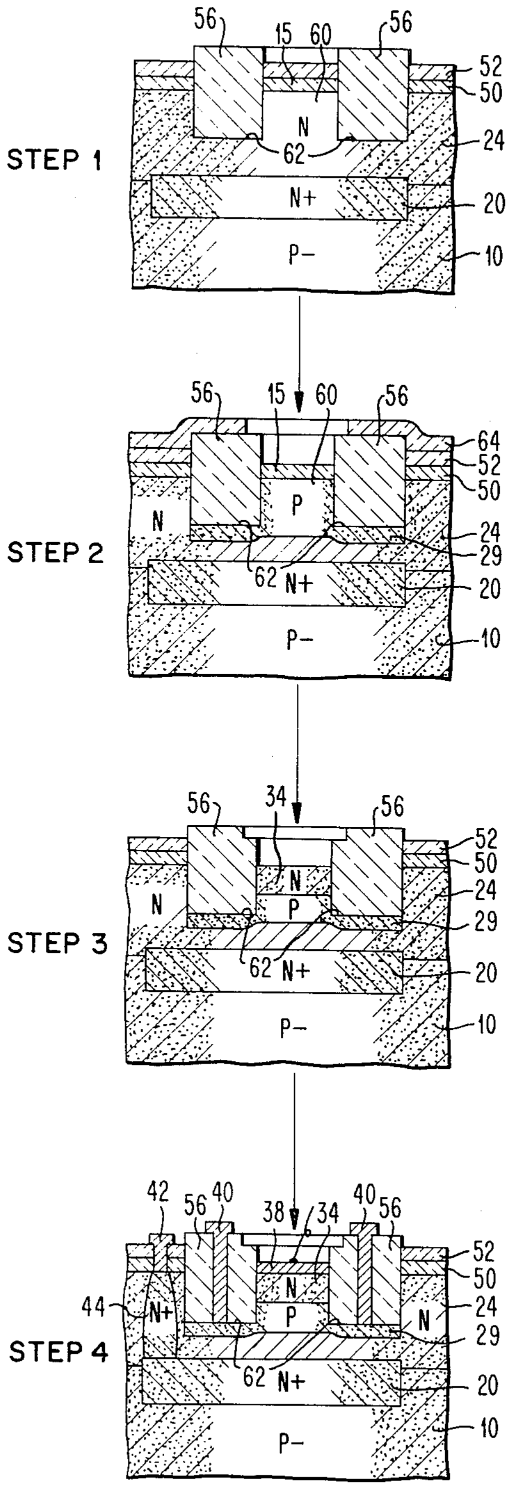
FIG. 2 is another series of sectional views in elevation illustrating another preferred embodiment of the method of the invention.
Figure 3:
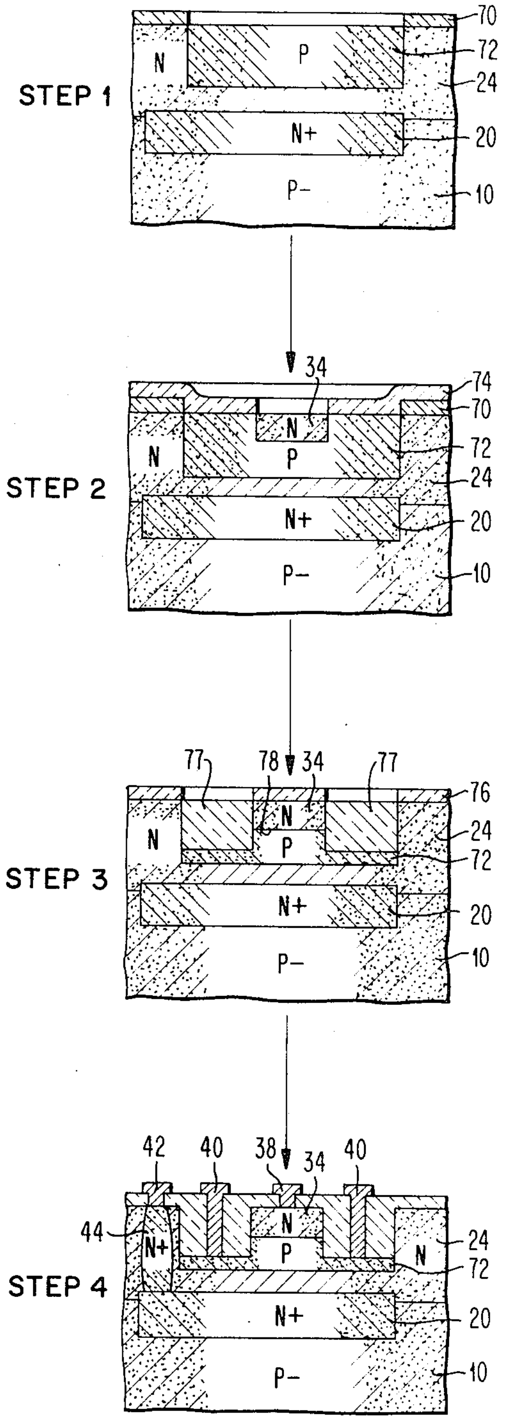
FIG. 3 is still another series of elevational views illustrating another preferred embodiment of the method of the invention.

Referring now to FIG. 2 there is depicted another preferred specific embodiment of the method of the invention. A subcollector region 20 is produced in wafer 10 by conventional masking and diffusion steps, and an epitaxial layer 24 grown on the surface of wafer 10. Subsequently a composite masking layer consisting of an $SiO_2$ layer 50 and an overlying silicon nitride layer 52 is deposited on the surface of epitaxial layer 24 by the same method described in alternate Step 1 of FIG. 1. The masked wafer is then exposed to an oxidizing atmosphere resulting in a thermally grown oxide 56 in the region overlying the ultimate extrinsic base regions of the device. This results in the formation of a pedestal portion 60 surrounded by a depressed generally annular surface 62 in the epitaxial layer 24. In regard to the thickness of layer 56 it has been found that 6000 A. of the oxide produces approximately a 2500 A. step or depression in the layer 24. As shown in Step 2 a masking $SiO_2$ layer 64 is then deposited over the ultimate extrinsic base regions as well as over the surfaces of layer 52. This masking layer can be $SiO_2$ which can be fabricated by conventional photolithographic techniques. Preferably layer 64 is a layer of pyrolytic oxide. The opening in layer 64 is exposed with a mask preferably larger than the masking portion 15 overlying the pedestal but smaller than the combined areas of surface 62 and pedestal 60. The overlying $Si_3N_4$ layer of masking portion 15 is then removed through the opening. During the nitride etching the oxide layer 56 forms the mask to define the nitride portion over the pedestal. The registration of the mask opening used to form the opening in 64 is thus not critical. Base region 28, that is, the extrinsic base as well as the intrinsic base regions are then formed by diffusing gallium as an impurity. The gallium diffuses through oxide layers 56 as well as the oxide layer 50 overlying the intrinsic base region or pedestal. The silicon nitride layer 52 prevents diffusion in the other portions of epitaxial layer 24. A short etching cycle is then performed to remove the layer of oxide 50 over the top of the pedestal and preferably also the masking layer 64. The collector contact hole can be opened through both layers 50 and 52 during the aforementioned operation. The emitter is then diffused using a suitable impurity as for example arsenic and/or phosphorus which results in emitter region 34 located in the upper portion of the pedestal. The emitter region is then covered by suitable passivating layers such as glass, silicon nitride, silicon dioxide or the like and the various collector base and emitter terminals 42, 40, and 38 fabricated by conventional techniques. As in the device disclosed in FIG. 1 the resultant transistor structure can be isolated by suitable techniques not described herein. If desired the emitter contact can be deposited over the entire exposed surface of the emitter as shown in Step 4. Referring now to FIG. 3 there is disclosed yet another preferred specific embodiment of the method of the invention. A collector region 20 and an overlying epitaxial layer 24 is fabricated on wafer 10 as previously described in reference to FIG. 2. A masking layer 70 is then deposited on the surface of epitaxial layer 24, an opening made overlying the ultimate base region, and a base diffusion made resulting in region 72. A masking layer 74 is then deposited on the surface to define the region of the emitter and the emitter diffusion made by conventional techniques resulting in the formation of emitter region 34. As shown in Step 3, the emitter region is then covered by a suitable masking portion 76 leaving exposed the extrinsic base region. The device is then heavily bombarded with nitrogen or oxide ions at an energy sufficient to produce doping to a level below the surface of the emitter base junction 78, and the device heated to cause the implanted ions to react with the silicon in epitaxial layer 24. This results in the formation of a layer 77 of $SiO_2$ or $Si_3N_4$ which isolates the emitter base junction. The method for forming insulating layers in a semiconductor device by ion implantation and heating is described in commonly assigned application Ser. No. 821,908 filed May 5, 1969, now U.S. Pat. 3,622,382. Subsequently emitter base and collector terminals 38, 40, and 42 are fabricated in the device by conventional techniques. As with the other two preferred embodiments of the transistor of the invention the device can be isolated when used in integrated circuit devices by any suitable technique. Further any suitable passivating technology can be utilized as well as metallurgy to connect the device with associated elements of an integrated circuit device. The various regions can be alternately formed by ion implantation.

In the transistor devices produced by the aforedescribed methods the emitter base junctions terminate in the sidewalls of a pedestal. This structure eliminates the side walls of the emitter found in conventional planar type devices. Accordingly the capacitance of the emitter base junction is reduced since there are no side walls to add to the capacitance which results in a device having a faster operation. In addition, elimination of emitter sides in extrinsic base region results in concentration of current carrier flow only through intrinsic (shorter) base width region when transistor emitter base junction is forward biased. The transit time through intrinsic base is shorter and hence cutoff frequency of the transistor which is inversely proportional to the transit time is higher than that of the conventional planar transistor. Moreover minority carrier storage in extrinsic base is reduced making the delay to switch the device shorter. Unlike the conventional planar type devices where the impurity concentration in the base and emitter regions is the highest at the surface of the device due to inherent diffusion techniques, this device eliminates this area of high impurity concentrations on two sides of the junction. Thus the probability of tunneling which is high in the planar device due to the high concentration is eliminated. Further a dislocation density and subsequent increase in trapping centers present in conventional devices due to the high impurity concentration at the surface is eliminated. Elimination of side injection current by the structure of this invention eliminates causes of decrease in current gain, noise, and increase in capacitance.

While the invention has been particularly shown and described with reference to preferred embodiments thereof, it will be understood by those skilled in the art that various changes in form and details may be made therein without departing from the spirit and scope of the invention.

I claim:

1. A method of fabricating a high speed transistor comprising forming a masking layer of silicon dioxide or silicon nitride on a monocrystalline silicon semiconductor body of one conductivity type and providing a central annular opening in said masking layer thereby producing an isolated central masking area and annularly exposing the monocrystalline semiconductor body, thermally oxidizing the semiconductor body to preferentially oxidize the annular exposed and unmasked portion to form a pedestal portion projecting from resultant surrounding annular recessed area in the semiconductor body followed by, removing substantially all said thermal oxidation surface layer exposing said central pedestal area, followed by diffusing an impurity dopant of the opposite conductivity type into said semiconductor body thereby forming a sub-collector region and the removal of remaining said thermal oxidation surface layer and depositing on said semiconductor surface an epitaxial layer containing the previously diffused dopant forming a collector region, forming upon said epitaxial deposition a base forming masking layer while maintaining exposed the central pedestal portion and annular adjacent area, diffusing an impurity dopant of said one conductivity type through said masking thereby forming a base region, forming a masking layer over the extrinsic base region leaving exposed the surface of the pedestal and introducing an impurity dopant of opposite conductivity type thereby forming an emitter region, forming a reach-through diffusion opening at the periphery of said transistor and establishing ohmic contacts with the collector region, base region and emitter region of the resultant transistor device, followed by forming a passivating layer over the entire transistor surface.

2. The method of claim 1 wherein said masking layer is a composite layer of silicon dioxide in combination with an overlying layer of silicon nitride.

3. A method of fabricating a high speed transistor comprising forming a mask on a monocrystalline silicon body of one conductivity type and diffusing a sub-collector region of opposite conductivity type into the surface of said body, depositing an epitaxial layer of said opposite conductivity type on said surface, forming a composite silicon oxide and overlying silicon nitride masking layer on said epitaxial layer and providing a central annular opening in said masking layer thereby producing an isolated central masking area and annularly exposing the surface of said epitaxial layer, thermally oxidizing the exposed layer to preferentially oxidize the annular exposed and unmasked area surrounding said isolated central masked portion to form a pedestal portion projecting from resultant surrounding annular recessed area in the epitaxial layer followed by, forming a masking layer over the extrinsic base region as well as over the composite masking layer leaving exposed the surface of said pedestal and removing the silicon nitride layer portion from the top of said pedestal leaving the underlying thermal oxide intact, diffusing gallium through the thermal oxide forming the extrinsic base region and through the pedestal to form the intrinsic base region, removing the oxide from the top surface of the pedestal and intorducing an impurity dopant of opposite conductivity type through the exposed top surface of the pedestal to form the emitter region located in the upper portion of the pedestal, forming a reach-through diffusion opening at the periphery of said transistor and establishing ohmic contacts with the collector region, base region and emitter region of the resultant transistor device, followed by forming a passivating layer over the entire transistor surface.

4. The method of claim 3 wherein a layer of $SiO_2$ is deposited over the silicon nitride layer, forming an opening in the $SiO_2$ layer over the pedestal, removing the resultant exposed $Si_3N_4$ portion over the pedestal using the $SiO_2$ layer as an etchant masking layer, and subsequently removing the underlying exposed $SiO_2$ layer over the pedestal by dipping the wafer in an etchant for $SiO_2$.

References Cited

UNITED STATES PATENTS

| | | | |
|---|---|---|---|
| 3,530,343 | 9/1970 | Irie et al. | 148—186 X |
| 3,370,995 | 2/1968 | Lowery et al. | 148—175 |
| 3,484,313 | 12/1969 | Tauchi et al. | 148—187 |
| 3,477,886 | 11/1969 | Ehlenberger | 148—187 |
| 3,194,699 | 7/1965 | White | 148—186 |
| 3,210,225 | 10/1965 | Brixey | 148—187 |
| 3,220,896 | 11/1965 | Miller | 148—175 X |
| 3,534,234 | 10/1970 | Clevenger | 317—235 |
| 3,442,011 | 5/1969 | Strieter | 29—578 |

FOREIGN PATENTS

| | | | |
|---|---|---|---|
| 1,159,637 | 7/1969 | Great Britain | 148—187 |

L. DEWAYNE RUTLEDGE, Primary Examiner

W. G. SABA, Assistant Examiner

U.S. Cl. X.R.

29—578, 580; 117—201, 212; 148—1.5, 187, 190; 317—235 R